United States Patent [19]
Parras

[11] 4,395,690
[45] Jul. 26, 1983

[54] TWO-TERMINAL-PAIR NETWORK SIMULATING AN INDUCTANCE

[75] Inventor: Karl-Heinz Parras, Nuremberg, Fed. Rep. of Germany

[73] Assignee: TE KA DE Felten & Guilleaume Fernmeldeanlagen GmbH, Nuremberg, Fed. Rep. of Germany

[21] Appl. No.: 271,183

[22] Filed: Jun. 8, 1981

[30] Foreign Application Priority Data

Jun. 12, 1980 [DE] Fed. Rep. of Germany ....... 3021960

[51] Int. Cl.³ ............................................ H03H 11/48
[52] U.S. Cl. ..................................... 333/214; 307/494
[58] Field of Search ........................ 333/213, 214, 169; 307/490, 494

[56] References Cited

U.S. PATENT DOCUMENTS 2,968,773  1/1961  Sandberg ........................... 333/213
3,418,561  12/1968  Feldman ........................ 333/214 X

OTHER PUBLICATIONS

Sudo et al., *A Constituting Method of Floating Inductance and Its Application in All–Pass–Network*, Trans. of IECE of Japan, vol. 60, No. 8, Aug. 1977, pp. 403, 404.

*Primary Examiner*—Paul L. Gensler
*Attorney, Agent, or Firm*—Michael J. Striker

[57] ABSTRACT

A two-terminal-pair circuit which simulates an inductance includes input and output terminal pairs and a first ohmic resistor. The voltage-carrying terminal of the input terminal pair is connected to one terminal of the first ohmic resistor. The circuit includes a bridge circuit having bridge branches and two opposite bridge diagonal terminals, two capacitors each connecting a respective one of the two bridge diagonal terminals to a respective one of the terminals of the first ohmic resistor, and a difference amplifier having two inputs each connected to a respective one of the two bridge diagonal terminals. The output of the difference amplifier is connected to the base of a transistor whose collector-emitter path is connected in one of the bridge branches in series with an effective resistor or with a parallel circuit comprising a capacitive reactance and an effective resistor. The emitter of the transistor is connected to the other terminal of the first resistor, and the collector of the transistor forms the voltage-carrying terminal of the output terminal pair.

9 Claims, 3 Drawing Figures

TWO-TERMINAL-PAIR NETWORK SIMULATING AN INDUCTANCE

BACKGROUND OF THE INVENTION

The present invention concerns two-terminal-pair networks which simulate an inductance.

Federal Republic of Germany published patent application DE-AS No. 15 37 661 discloses a circuit exhibiting inductive reactance but containing no inductor coil or other such inductive structure, the circuit being used to realize, in integrated-circuit technique, a selective amplifier. This inductive-reactance circuit is a four-port network and is used as a feedback network for an in-phase amplifier, i.e. an amplifier whose output and input voltages are in phase with each other. If for such feedback circuit use is made of a bridge circuit, and if the bridge is in balanced condition, then there is no feedback of voltage from the output to the input of the amplifier. One of the branches of the bridge circuit contains a damped resonant circuit, thereby establishing a frequency-dependent damping for the two-terminal-pair negative feedback network, the damping being lowest at the resonant frequency. Depending on whether the input and output voltages of the amplifier are in-phase or phase-opposed, and depending on which of the bridge resistors is, in view of the ground connections, best suited for replacement by the resonant circuit, use can be made of a series resonant circuit, or else of a parallel resonant circuit, in order, besides the resonant frequency, to achieve lower damping in the negative-feedback network and in order to prevent phase inversion. In one embodiment, the junction between two bridge branches is grounded. One bridge resistor is realized by an auxiliary amplifier to whose output is connected a capacitor. If the auxiliary amplifier has a strong negative-feedback action, then the inductive apparent impedance of the circuit is almost constant.

For transmission of display-screen text via a telephone channel, it is necessary to use a modem which matches the data-signal spectrum to the bandwidth of the telephone channel. Due regulations and restrictions pertaining to transmission of display-screen text data, only a low remotely transmittable power level is available for energy supply to the various functional units involved in implementing the modem and for the junction components galvanically connected to the modem equipment. The current supply unit for the modem equipment should produce a constant operating voltage from the loop current of the communications or signal line, and in the modem equipment an active regulating circuit is provided, having a small D.C. input resistance, and serving to realize the smallest possible power loss. In order that the line signal not be substantially damped, it is necessary, simultaneously, to satisfy the requirement that the dynamic input resistance of the current supply be very high. To separate the D.C. current in the circuit from the signal components, use can be made of a passive choke, i.e., an inductor. Because the D.C. current fed to the current-supply circuit for the modem equipment is fed thereto via such choke, this means in a practical sense that the passive choke, at a loop current of approximately 60 mA, is not yet to be permitted to saturate and, as an additional requirement, its ohmic resistance, i.e., the voltage drop across the choke, must be small. In the embodiment disclosed in the aforementioned publication, the A.C. signal component is superimposed upon a D.C. current component (17 . . . 60 mA loop current). If a higher voltage drop develops across the passive choke, this results in an increased D.C. input resistance to the current supply unit, so that the maximum permissible value therefor is exceeded. In order to prevent this, it would therefore ordinarily be necessary to design the passive choke with a large cross-section, so that the choke would then be first of all large, and furthermore due to the high copper content, heavy.

SUMMARY OF THE INVENTION

Accordingly, it is an object of the present invention to provide an inexpensive to produce, active, electronic choke which has a very low resistance value, and which can be readily incorporated in a subscriber's set, to be used in the context explained above for energy-source circuitry such as discussed above.

In the presently preferred two-terminal-pair embodiments of the invention, the foregoing is achieved as follows. The voltage-carrying (i.e., ungrounded) terminal of the circuit's input terminal pair is connected with one of the two terminals of a first ohmic resistor. The two terminals of this first resistor are connected, via respective ones of two capacitors, to respective ones of the two opposite terminals of the diagonal of a bridge circuit. The diagonal of such bridge circuit is comprised of the input circuit to a difference amplifier; i.e., one input of the difference amplifier is connected to one of the two opposite terminals of the diagonal of the bridge circuit, and the other input of the difference amplifier is connected to the other of the two opposite terminals of the bridge-circuit diagonal. The output of the difference amplifier is connected to the base of a transistor. The collector-emitter path of the transistor is located in a branch of the bridge circuit either in series with an effective resistor or with a parallel circuit comprised of a capacitive reactance and an effective resistor. The emitter of the transistor is connected to the other of the two terminals of the first resistor, and the transistor's collector is connected to the voltage-carrying terminal of the output terminal pair of the inventive two-terminal-pair circuit.

This circuit configuration is distinguished by simplicity and by a desirable and convenient correspondence between its abstract configuration and its manner of operation; i.e., its manner of operation can be easily kept in mind by designers working with its configuration. Furthermore, the inventive circuit can be realized using conventional, commercially available and inexpensive circuit components. As for the circuit itself, its stability criteria are easy to take into account when selecting the various resistance ratios of the circuit and the characteristics of the of the active components thereof. This is explained as follows. If one could avail oneself of an ideal operational amplifier, i.e. an ideal, controllable voltage source, then the inventive circuit would behave as a dissipative (heat-dissipating) inductor. In more practical terms, using a real-life operational amplifier having a finite voltage gain and exhibiting a gain decrease at higher frequencies, the resulting equivalent circuit diagram is that of a parallel resonant circuit having a certain resonant frequency, at which frequency the input resistance of the circuit is of particularly high ohmic value. By intelligent circuit dimensioning, the circuit's input impedance can be made very high in a frequency range containing the frequencies which will actually be encountered by the circuit for its intended use.

The novel features which are considered characteristic for the invention are set forth in particular in the appended claims. The invention itself, however, both as to its construction and its method of operation, together with additional objects and advantages thereof, will be best understood from the following description of specific embodiments, when read in connection with the accompanying drawing.

DESCRIPTION OF THE PREFERRED EMBODIMENTS

Figure 1:
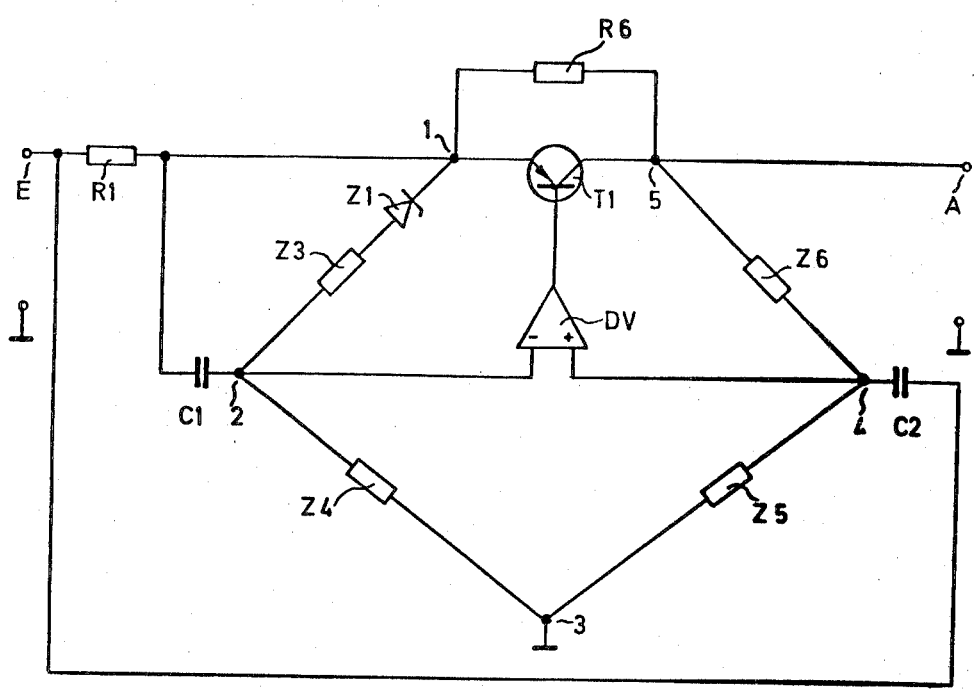
FIG. 1 depicts a first embodiment of the present invention.

In the embodiments illustrated here, use happens to be made of pnp transistors; however, it will be understood that this is merely exemplary and not exclusive. Emphasis is placed, in the following description, upon the manner of operation of the inventive circuits, the connection of various illustrated circuit elements to one another being clear from the drawing itself.

Figure 1A:
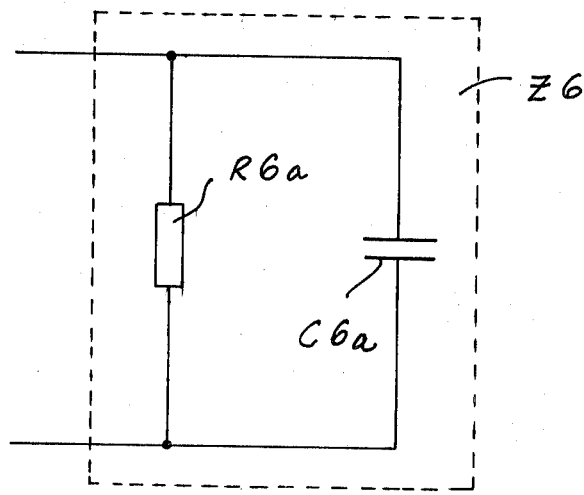
FIG. 1a depicts another embodiment of an impedance Z6.

FIG. 1 depicts a bridge circuit, one branch thereof containing the series connection of the collector-emitter path of a transistor T1 and an impedance Z6. As shown in FIG. 1a, the impedance Z6 can consist of a parallel circuit comprising a capacitive reactance C6a and an effective resistor R6a. In that case the frequency dependence of the impedance Z6 must be taken into account. The employment of an impedance Z6 either as shown in FIG. 1a or consisting only of an effective resistor R6a would have no consequence, supposing that the stability criteria was fulfilled, for the principle working of the inventive circuit. The base of transistor T1 is controlled by the output of a difference amplifier DV. The inverting and non-inverting inputs of the bridge circuit are, as shown, connected to respective ones of the two opposite terminals 2, 4 of the bridge circuit's diagonal. D.C. current from a (non-illustrated) rectifier is applied to the left terminal of an ohmic resistor R1, and there is superimposed on the D.C. current an A.C. current which is used, in the illustrated embodiment, for signal transmission. As the intended use for the illustrated embodiment, the just mentioned D.C. current is employed to energize the (non-illustrated) modem equipment for transmission of display-screen text data via a telephone or communications line. The criteria and limit conditions which such a circuit must satisfy have been discussed further above. Bridge-circuit configuration per se is well known, and therefore need not be reviewed here. Furthermore, the supply of energizing current to the (non-illustrated) modem equipment is regulated by a (non-illustrated) shunt regulator which may be connected to the output of the illustrated circuit; the shunt regulator may also be employed in the supply of energizing current to the difference amplifier DV of the illustrated circuit.

The difference amplifier DV is here formed by an operational amplifier. Amplifier DV, whose output is connected to the base of transistor T1, automatically adjusts the operating point of transistor T1, in accordance with bridge-circuit principles, until the bridge formed by impedances Z3, Z4, Z5 and Z6 is brought into balance. In the present embodiment, the impedances Z3, Z4, Z5 and Z6 are preferably simple ohmic resistors; otherwise, the frequency dependence of these impedances must, of course, also be taken into account. The balancing of the bridge circuit, i.e., with respect to D.C. voltage, results in a certain voltage drop appearing across the collector-emitter path of transistor T1. The operating point is so selected that the transistor T1, for the maximum signal amplitude to be expected, will not enter into its saturation region. The power loss of the illustrated circuit can be kept low by selecting the ohmic value of resistance R1 at a low value (approximately 10 ohms). The power loss is further reduced by the connection of resistor R6 in parallel to the collector-emitter path of transistor T1; the current-dividing action which resistor R6 provides reduces the base current for the transistor. The capacitors C1, C2 are, as shown in FIG. 1, each connected to a respective one of the two terminals of the ohmic resistor R1 and also to a respective one of the two opposite terminals 2, 4 of the bridge-circuit diagonal. When no A.C. signal voltage is present, but instead only D.C. voltage, the capacitors C1, C2 can be imagined removed, to facilitate description. For the case of D.C. current, there is a voltage drop across resistor R1 corresponding to its resistance value. The voltage drop on resistor R1 serves to divert the control voltage at the difference amplifier DV, which has the effect that the circuit arrangement behaves in a high-ohmic manner with respect to A.C. voltage.

If an A.C. voltage component is superimposed on the D.C. voltage, i.e., if a signal transmission occurs, then, if the capacitors C1, C2 were not present, the loop current would change to the same extent through the resistor R1, through the collector-emitter path of transistor T1, and through the resistor R6. A smaller voltage drop at R1 is, via the capacitors C1 and C2, applied to the inverting and non-inverting input of the difference amplifier DV. The collector-emitter voltage of transistor T1 follows the course of the signal voltage. The difference amplifier DV controls the transistor T1, in correspondence to the time constant of the circuit, in such a manner that no long-term voltage change appears via the resistor R1. No voltage change at resistor R1 due to the circuit elements connected thereto means that the current through resistor R1 remains approximately constant, and, because the current through R1 remains constant independently of the magnitude of the signal, this means that the circuit arrangement behaves in a high-ohmic manner with respect to A.C. voltage. Thus is the desired choke behavior realized.

The internal resistance of the operational amplifier DV is approximately zero. In the input circuit family of characteristic curves of transistor T1, this means that the load line extends approximately parallel to the abscissa. The difference voltage between the inverting and non-inverting input of the difference amplifier DV is equal to zero. If there is an increase in the current through the resistor R1, and consequently also an increase in the voltage drop across resistor R1, then the voltage increase appears, amplified, at the output of difference amplifier DV. The voltage at the emitter of transistor T1 increases, because the collector of transistor T1 is held fixed due to the (non-illustrated) shunt regulator connected to the output of the illustrated circuit. Due the manner in which the transistor T1 is connected in the circuit, when the emitter potential increases there is a decrease of the base current and accordingly also of the collector current, the latter in correspondence to the current amplification factor. An increase of the signal voltage effects a large collector-current change in the opposite direction, so that the current increase is balanced out by the resistor R1 and the loop current between the voltage-carrying terminal E of the input terminal pair and the voltage-carrying terminal A of the output terminal pair has not changed.

The A.C. signal voltage can vary within the operative range of transistor T1, i.e., between cutoff and saturation. The maximum processable signal amplitude is determined by the zener voltage of a zener diode Z1, which is provided in series to the bridge resistor Z3 in one of the bridge branches. Accordingly, the balance criterion applies for the bridge resistors Z3, Z4, Z5 and Z6, and at the voltage-carrying terminal A of the output terminal pair there is established a fixed but arbitrary potential relative to ground. When the (non-illustrated) equipment for the modem is switched on, the resistor R6 makes possible a current flow from terminal E to terminal A, so that the (non-illustrated) shunt regulator connected to the output of the illustrated circuit can begin to regulate the operating voltage and can supply the difference amplifier DV with current.

Figure 2:
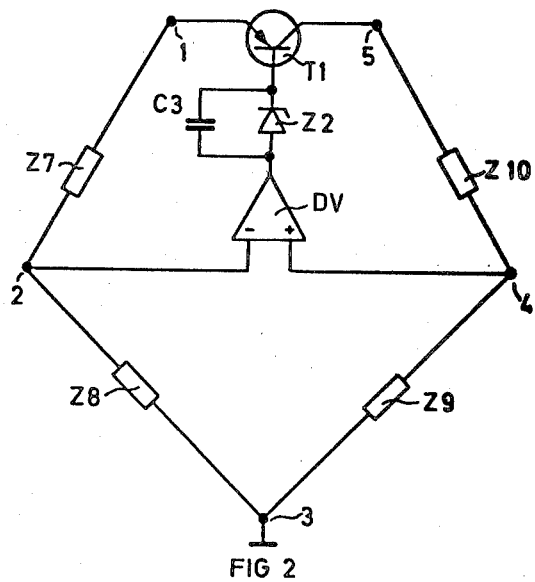
FIG. 2 depicts another embodiment of the present invention.

If, as shown in FIG. 2, the zener diode Z2 is arranged between the output of difference amplifier DV and the base of transistor T1, then the voltage level at the output of the difference amplifier is matched to the transistor T1. This matching of potential results from the fact that the maximum output voltage of the operational amplifier can be higher than the operating voltage, and, in order that the transistor T1 can become non-conductive, the base voltage of transistor T1 must be lifted. The bridge impedances are so dimensioned that a sufficiently high collector-emitter voltage is established on the transistor T1 corresponding to the required amplitude of the signal voltage. If the operating voltage of the modem equipment is produced between the voltage-feeding terminal A of the output terminal pair and ground by a zener diode, and if the zener diode is arranged as shown in FIG. 2, then there is established at the terminal A a fixed potential relative to ground. If the zener diode Z2 is bridged over by a capacitor C3, this results in good behavior for the A.C. voltage. In this embodiment, there is a further advantage that the capacitors C1 and C2 can be easily separated off by switch means. The circuit arrangement then no longer behaves as a dissipative inductor but instead as a low-ohmic resistor. For example, if selector signals are transmitted via a telephone or communications line between a telephone apparatus and a display-screen-text central, then the selector or dialing signals would be distorted by the presence of the auxiliary inductance.

It will be understood that each of the elements described above, or two or more together, may also find a useful application in other types of circuits differing from the types described above.

While the invention has been illustrated and described as embodied in a circuit intended to simulate an inductance, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A two-terminal-pair circuit having an input terminal pair and an output terminal pair and simulating an inductance, the circuit comprising a first ohmic resistor, the voltage-carrying terminal of the input terminal pair being connected to one terminal of the first ohmic resistor, a bridge circuit having bridge branches and two opposite bridge diagonal terminals, two capacitors each connecting a respective one of the two bridge diagonal terminals to a respective one of the terminals of the first ohmic resistor, a difference amplifier having two inputs each connected to a respective one of the two bridge diagonal terminals, a transistor having a base connected to the output of the difference amplifier, the transistor having a collector-emitter path connected in a bridge branch in series with an impedance, the emitter of the transistor being connected to the other terminal of the first resistor, and the collector of the transistor forming the voltage-carrying terminal of the output terminal pair.

2. The circuit defined in claim 1, the impedances of the other bridge branches being ohmic impedances, the junction between two of the bridge branches being connected to ground, the junction opposite to the junction just mentioned being connected to the emitter of the transistor.

3. The circuit defined in claim 1, furthermore including a second ohmic resistor connected in parallel to the collector-emitter path of the transistor.

4. The circuit defined in claim 1, furthermore including a zener diode which connects the output of the difference amplifier to the base of the transistor, and furthermore including a capacitor connected in parallel with the zener diode.

5. The circuit defined in claim 1, the difference amplifier being formed by an operational amplifier having a non-inverting input and an inverting input, the non-inverting input being connected via one of the capacitors to the voltage-carrying terminal of the input terminal pair, the inverting input being connected via the other capacitor and via the first resistor to the voltage-carrying terminal of the input terminal pair.

6. The circuit defined in claim 1, one of the bridge branches including a zener diode and a bridge impedance connected in series with each other.

7. The circuit defined in claim 6, the anode of the zener diode being connected to one terminal of the impedance with which it is connected in series, the cathode of the zener diode being connected to the opposite junction of the bridge circuit.

8. The circuit defined in claim 1, the impedance consisting of an effective resistor.

9. The circuit defined in claim 1, the impedance comprising a capacitive reactance and an effective resistor.

* * * * *